United States Patent
Alexeev et al.

(10) Patent No.: US 9,356,626 B2
(45) Date of Patent: May 31, 2016

(54) DATA ENCODING FOR DATA STORAGE SYSTEM BASED ON GENERALIZED CONCATENATED CODES

(71) Applicant: EMC Corporation, Hopkinton, MA (US)

(72) Inventors: Alexander N. Alexeev, Saint-Petersburg (RU); Peter V. Trifonov, Saint-Petersburg (RU); Vera D. Miloslavskaya, Saint-Petersburg (RU)

(73) Assignee: EMC Corporation, Hopkinton, MA (US)

( * ) Notice: Subject to any disclaimer, the term of this patent is extended or adjusted under 35 U.S.C. 154(b) by 103 days.

(21) Appl. No.: 14/167,314

(22) Filed: Jan. 29, 2014

(65) Prior Publication Data

US 2014/0380114 A1 Dec. 25, 2014

(30) Foreign Application Priority Data

Jun. 20, 2013 (RU) ................................ 2013128346

(51) Int. Cl.
*H03M 13/29* (2006.01)
*H03M 13/15* (2006.01)
*H03M 13/11* (2006.01)

(52) U.S. Cl.
CPC ........ *H03M 13/2906* (2013.01); *H03M 13/152* (2013.01); *H03M 13/1515* (2013.01); *H03M 13/118* (2013.01)

(58) Field of Classification Search
CPC ...................... H03M 13/2906; H03M 13/1515; H03M 13/152; H03M 13/2903; H03M 13/118

USPC .......................................................... 714/755
See application file for complete search history.

(56) References Cited

U.S. PATENT DOCUMENTS

| | | | | |
|---|---|---|---|---|
| 4,907,233 A | * | 3/1990 | Deutsch et al. | 714/755 |
| 5,265,098 A | * | 11/1993 | Mattson | G06F 11/1008 |
| | | | | 714/6.12 |
| 5,946,328 A | * | 8/1999 | Cox et al. | 714/784 |
| 6,563,877 B1 | * | 5/2003 | Abbaszadeh | 375/242 |
| 7,484,165 B2 | * | 1/2009 | Griesser et al. | 714/782 |
| 7,782,232 B2 | * | 8/2010 | Yang et al. | 341/94 |
| 7,788,526 B2 | * | 8/2010 | O'Connor | G06F 11/1088 |
| | | | | 711/114 |

(Continued)

FOREIGN PATENT DOCUMENTS

WO 2014102565 A1 7/2014
WO 2014140676 A1 9/2014

OTHER PUBLICATIONS

Erdal Arikan, "Channel Polarization: A Method for Constructing Capacity-Achieving Codes for Symmetric Binary-Input Memoryless Channels," IEEE Transactions on Information Theory, Jul. 2009, pp. 3051-3073, vol. 55, No. 7.

(Continued)

*Primary Examiner* — James C Kerveros
(74) *Attorney, Agent, or Firm* — Ryan, Mason & Lewis, LLP

(57) ABSTRACT

Data is obtained at a data storage system. Codewords are generated from the obtained data. The codewords are computed using a generalized concatenated code and each codeword comprises symbols, wherein the symbols comprise information symbols and check symbols. The codewords are stored on an array of disks associated with the data storage system. In one example, i-th symbols of the generated codewords are stored on an i-th disk of the array of disks.

20 Claims, 9 Drawing Sheets

(56) References Cited

U.S. PATENT DOCUMENTS

| | | | |
|---|---|---|---|
| 8,386,879 B2* | 2/2013 | Djordjevic et al. | 714/752 |
| 9,026,893 B1* | 5/2015 | Syu | G06F 11/1076 714/773 |
| 2005/0091565 A1* | 4/2005 | Eroz et al. | 714/752 |
| 2008/0235556 A1* | 9/2008 | Eleftheriou et al. | 714/755 |
| 2008/0235562 A1* | 9/2008 | Eleftheriou et al. | 714/810 |
| 2010/0241928 A1* | 9/2010 | Kim et al. | 714/763 |
| 2012/0017136 A1* | 1/2012 | Ordentlich | G06F 11/1028 714/763 |
| 2012/0194363 A1* | 8/2012 | Korodi | H03M 7/40 341/87 |
| 2012/0233518 A1* | 9/2012 | Lee et al. | 714/755 |
| 2013/0013974 A1* | 1/2013 | Cideciyan et al. | 714/755 |
| 2014/0006850 A1 | 1/2014 | Aliev et al. | |
| 2015/0248325 A1* | 9/2015 | Calderbank | G06F 11/1048 714/768 |

OTHER PUBLICATIONS

M. Blaum et al., "EVENODD: An Optimal Scheme for Tolerating Double Disk Failures in RAID Architectures," Proceedings of the 21st Annual International Symposium on Computer Architecture (ISCA), Apr. 1994, pp. 245-254.

M. Blaum et al., "On Lowest Density MDS Codes," IEEE Transactions on Information Theory, Jan. 1999, pp. 46-59, vol. 45, No. 1.

Y. Cassuto et al., "Cyclic Lowest Density MDS Array Codes," IEEE Transactions on Information Theory, Apr. 2009, pp. 1721-1729, vol. 55, No. 4.

P. Corbett et al., "Row-Diagonal Parity for Double Disk Failure Correction," Proceedings of the 3rd USENIX Conference on File and Storage Technologies (FAST), Mar.-Apr. 2004, 15 pages.

James S. Plank, "A Tutorial on Reed-Solomon Coding for Fault-Tolerance in RAID-Like Systems," Software-Practice and Experience, Sep. 1997, pp. 995-1012, vol. 27, No. 9.

James S. Plank, "The RAID-6 Liberation Codes," Proceedings of the 6th USENIX Conference on File and Storage Technologies (FAST), 2008, pp. 97-110.

Michael O. Rabin, "Efficient Dispersal of Information for Security, Load Balancing, and Fault Tolerance," Journal of the Association for Computing Machinery (JACM), Apr. 1989, pp. 335-348, vol. 36, No. 2.

Peter Trifonov, "Efficient Design and Decoding of Polar Codes," IEEE Transactions on Communications, Nov. 2012, pp. 3221-3227, vol. 60, No. 11.

U. Wachsmann et al., "Multilevel Codes: Theoretical Concepts and Practical Design Rules," IEEE Transactions on Information Theory, Jul. 1999, pp. 1361-1391, vol. 45, No. 5.

L. Xu et al., "X-Code: MDS Array Codes with Optimal Encoding," IEEE Transactions on Information Theory, Jan. 1999, pp. 272-276, vol. 45, No. 1.

Mario Blaum, "A Family of MDS Array Codes with Minimal No. Of Encoding Operations," IEEE International Symposium on Information Theory (ISIT), Jul. 2006, pp. 2784-2788.

E.L. Blokh et al., "Coding of Generalized Concatenated Codes," Problems of Information Transmission, 1974, pp. 45-50, vol. 10, No. 3.

V.A. Zinov'Ev, "Generalized Cascade Codes," Problems of Information Transmission, 1976, pp. 5-15, vol. 12, No. 1.

U.S. Appl. No. 14/122,404 filed in the name of A.A. Aliev et al. on Nov. 26, 2013 and entitled "Polar Codes for Efficient Encloding and Decoding Data in Redundant Disk Arrays."

U.S. Appl. No. 14/236,270 filed in the name of A.A. Aliev et al. on Jan. 30, 2014 and entitled "Balancing Load on Disks in RAID Based on Linear Block Codes."

* cited by examiner

GETOUTERCODESDIMENSIONS($n$, $v$, $K$, $\alpha$, $(p_1,...,p_v)$)
1  $P_{max} \leftarrow 1$
2  $P_{min} \leftarrow 0$
3  while $P_{max} - P_{min} > \alpha P_{max}$
4  do
5      $P_{average} \leftarrow (P_{max} + P_{min})/2$
6      $k_i \leftarrow \max\{s \in \{0,...n\} | P_i(s) \leq P_{average}\}$
7      if $\sum_{i=1}^{v} k_i < K$
8          then
9              $P_{min} \leftarrow P_{average}$
10         else
11             $P_{max} \leftarrow P_{average}$
12 return $(k_1,...,k_v)$

| $c_{4,1}$ | $c_{4,2}$ | $c_{4,3}$ | $c_{4,4}$ |
| $c_{3,1}$ | $c_{3,2}$ | $c_{3,3}$ | $c_{3,4}$ |
| $c_{2,1}$ | $c_{2,2}$ | $c_{2,3}$ | $c_{2,4}$ |
| $c_{1,1}$ | $c_{1,2}$ | $c_{1,3}$ | $c_{1,4}$ |

FIG. 6

```
NESTEDINFORMATIONSETSOPT(T, L, (G^(1),..., G^(v)), (ρ^(1),..., ρ^(v)))
1    Q'^(i) ← ∅,  i = 1..v
2    for m ← 1 to T
3    do Q^(i) ← ∅,  i = 1..v
4        λ^(i) ← (0,...,0),  i = 1..v
5        for l ← 1 to L
6        do I_l^(i) ← ∅,  i = 1..v
7            q ← 1
8            for t = 1 to v
9            do for s = q to k_t
10               do Find j', s.t. G_{*,j'}^(i) is linearly independent
                    with all G_{*,j}^(i) : j ∈ I_l^(i) and λ_{j'}^(i) is maximized,
                    i = t..v; break ties randomly
11               I_l^(i) ← I_l^(i) ∪ {j'},  i = t..v
12               q ← k_i
13           Apply elementary rows operations to G^(i) to obtain
                identity matrix on positions given by I_l^(i),  i = 1..v
14           λ_{j'}^(i) ← λ_{j'}^(i) + ρ_{j'}^(i) weight(G_{*,j'}^(i)),  i = 1..v
15           Q^(i) ← Q^(i) ∪ {I_l^(i)},  i = 1..v
16       λ_j^(i) ← λ_j^(i)/L,  i = 1..v, j = 1..n
17       if Σ_{i=1}^v F(Q^(i)) < Σ_{i=1}^v F(Q'^(i))
18           then Q'^(i) ← Q^(i),  i = 1..v
19   return (Q'^(1),..., Q'^(v))
```

| CODE LENGTH $n$ | CLASSICAL ENCODING | | | PROPOSED ALGORITHM | | |
|---|---|---|---|---|---|---|
| | $k = 0.7n$ | $k = 0.8n$ | $k = 0.9n$ | $k = 0.7n$ | $k = 0.8n$ | $k = 0.9n$ |
| 24 | 52 | 40 | 20 | 30 | 24 | 20 |
| 32 | 96 | 84 | 42 | 47 | 51 | 28 |
| 40 | 115 | 112 | 71 | 45 | 50 | 38 |
| 48 | 172 | 143 | 89 | 64 | 62 | 48 |
| 56 | 229 | 190 | 134 | 77 | 75 | 70 |
| 64 | 313 | 253 | 180 | 97 | 91 | 83 |
| 80 | 425 | 343 | 278 | 139 | 123 | 131 |
| 96 | 599 | 457 | 341 | 184 | 156 | 158 |
| 112 | 745 | 622 | 449 | 218 | 198 | 187 |
| 128 | 960 | 826 | 558 | 254 | 231 | 217 |

FIG. 8

| | USABLE CAPACITY | 1 | 2 | 4 | 8 | 16 | 84 |
|---|---|---|---|---|---|---|---|
| EVEN ODD 4+2 | 0.67 | 5.12X | 4.93X | 4.56X | 3.88X | 1.75X | 1.75X |
| RDP 4+2 | 0.67 | 3.56X | 3.56X | 3.56X | 3.68X | 1.75X | 1.75X |
| RS 4+2 | 0.67 | 6X + 6M | 5.5X + 5.5M | 3X + 2.75M | 3X + 2.75M | 3X + 2.75M | 3X + 2.75M |
| RS 8+3 | 0.73 | 10X + 6M | 9X + 5.5M | 7X + 3.5M | 3.9X + 1.75M | 3.9X + 1.75M | 3.9X + 1.75M |
| RS 16+3 | 0.84 | 10X + 6M | 9X + 5.5M | 7X + 3.5M | 5.25X + 2M | 3.25X + 0.88M | 3.25X + 0.875M |
| RS 32+4 | 0.89 | 23X + 12M | 16.5X + 9.5M | 12X + 6.75M | 9.13X + 3.63M | 4.8X + 1.4M | 4.8X + 1.4M |
| RS 64+6 | 0.91 | 41X + 17M | 27X + 13.5M | 19.3X + 10M | 14.4X + 5.5M | 11.9X + 2.8M | 6.25X + 0.84M |
| POLAR 24+6 | 0.8 | 4.5X | 4.46X | 3.42X | 4.33X | 3.21X | 1.75X |
| POLAR 32+7 | 0.82 | 5.25X | 5.25X | 5.25X | 5.25X | 4.48X | 2.25X |
| POLAR 64+10 | 0.86 | 5.31X | 5.31X | 5.31X | 5.31X | 5.31X | 2.15X |
| GCC 15+5 | 0.75 | 3.96X | 3.88X | 3.93X | 3.56X | 1.73X | |
| GCC 40+8 | 0.83 | 4.69X | 4.57X | 4.57X | 4.36X | 3.76X | 1.6X |
| GCC 55+9 | 0.86 | 4.83X | 4.7X | 4.69X | 4.57X | 4.00X | 1.64X |
| GCC 76+12 | 0.86 | 5.69X | 5.57X | 5.52X | 5.28X | 4.54X | 3.47X |
| GCC 111+17 | 0.87 | 6.95X | 6.81X | 6.69X | 6.23X | 5.31X | 3.73X |

NUMBER OF STRIPE UNITS UPDATED

800

DATA ENCODING FOR DATA STORAGE SYSTEM BASED ON GENERALIZED CONCATENATED CODES

FIELD

The field relates generally to data storage systems, and more particularly to techniques for data encoding in such data storage systems.

BACKGROUND

The increasing amount of data available in digital format requires developing appropriate data storage systems. In many cases, the amount of data to be stored exceeds the capacity of a single disk drive. Furthermore, the reliability of a single drive may not be sufficient for a particular application. This motivates the development of redundant disk arrays such as, for example, a Redundant Array of Independent Disks or RAID. The size of such arrays may vary from a few disks to a few thousand disks. A major challenge in their design is the development of efficient algorithms for calculating parity data, as well as for their recovery in case of disk failures. Such algorithms are based on encoding the data with some error/erasure correcting code (i.e., calculating parity data from the payload data), and storing different symbols of a codeword on different disks. That is, K disks are typically used to store the payload data, while N–K disks are used to store parity data, where N is the total number of disks in RAID group.

Numerous codes have been suggested for usage in storage applications, such as Reed-Solomon codes, Hamming codes, Remote Desktop Protocol, Even/Odd, Zigzag codes, etc. In general, the fraction (N–K)/N of parity disks needed to achieve given reliability decreases with the number of payload disks K. This motivates designing large disk arrays.

It is desirable to employ maximum distance separable (MDS) codes in the design of disk arrays. The crucial property of these codes is that they enable one to recover any combination of up to N–K erasures (disk failures). However, construction of MDS codes requires employing large alphabets. For example, Reed-Solomon codes and codes based on Cauchy matrices are defined over large finite fields $GF(2^m)$. The cost of the multiplication operation in such fields, which is needed for encoding and decoding of these codes, is much higher than that of the summation operation (exclusive-or, i.e., XOR). On the other hand, array codes are typically defined over the vector alphabet $GF(2)^m$. Their encoding and decoding algorithms require exclusively XOR operation, but the size of one codeword (stripe size) is m times larger than that of codes over $GF(2^m)$. In a practical system, this results in more frequent partial stripe update operations, which considerably degrade RAID performance. As such, improved data encoding techniques are needed that utilize non-MDS codes.

SUMMARY

Embodiments of the invention provide improved techniques for data encoding in data storage systems.

For example, in one embodiment, a method comprises the following steps. Data is obtained at a data storage system. Codewords are generated from the obtained data. The codewords are computed using a generalized concatenated code and each codeword comprises symbols, wherein the symbols comprise information symbols and check symbols. The codewords are stored on an array of disks associated with the data storage system. In one example, i-th symbols of the generated codewords are stored on an i-th disk of the array of disks.

In another embodiment, a computer program product is provided which comprises a processor-readable storage medium having encoded therein executable code of one or more software programs. The one or more software programs when executed by a processor implement one or more steps of the above-described method.

In yet another embodiment, an apparatus comprises a memory and a processor operatively coupled to the memory and configured to perform one or more steps of the above-described method.

In a further embodiment, a data storage system comprises an array controller operatively coupled to an array of disks. The array controller is configured to perform one or more steps of the above-described method.

Advantageously, the use of generalized concatenated codes according to embodiments of the invention provides significant fault tolerance in RAID-based data storage systems while reducing computational complexity as compared with conventional encoding techniques.

These and other features and advantages of the present invention will become more readily apparent from the accompanying drawings and the following detailed description.

BRIEF DESCRIPTION OF THE DRAWINGS

FIG. 4 illustrates a methodology for computing dimensions of outer codes according to an embodiment of the invention.

FIG. 5 illustrates a codeword symbol chart according to an embodiment of the invention.

FIG. 6 illustrates a load balancing methodology according to an embodiment of the invention.

FIG. 8 illustrates numbers of arithmetic operations for updating different stripes in different RAID systems according to one or more embodiments of the invention.

DETAILED DESCRIPTION

Embodiments of the present invention will be described herein with reference to exemplary computing systems, data storage systems, and associated servers, computers, storage devices and other processing devices. It is to be appreciated, however, that embodiments of the invention are not restricted to use with the particular illustrative system and device configurations shown. Moreover, the phrases "computing system," "processing platform," "data storage system," and "data storage system environment" as used herein with respect to various embodiments are intended to be broadly construed, so as to encompass, for example, private or public cloud computing or storage systems, or parts thereof, as well as other types of systems comprising distributed virtual infrastructure and those not comprising virtual infrastructure. However, a given embodiment may more generally comprise any arrangement of one or more processing devices.

Figure 1:
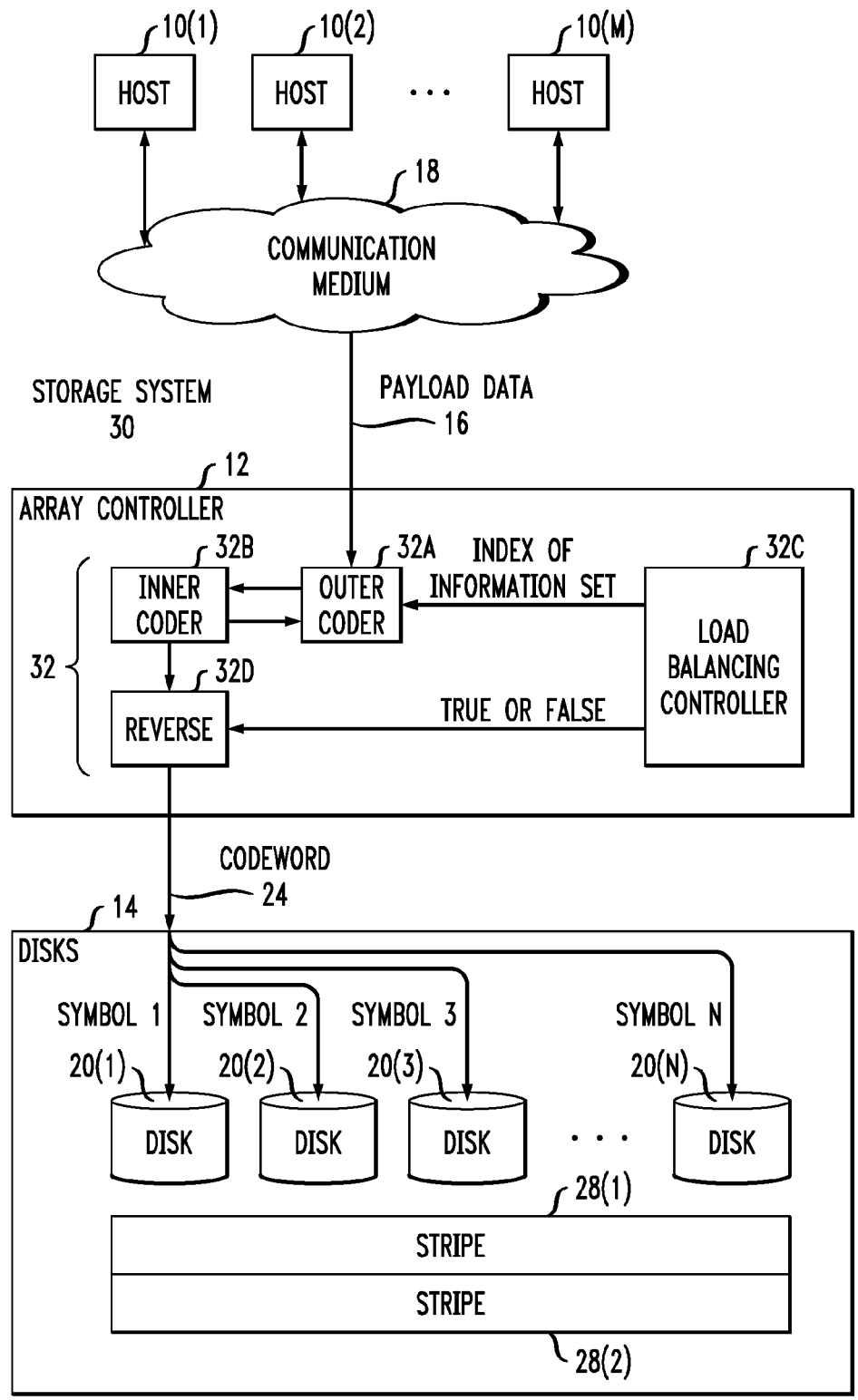
FIG. 1 illustrates a data storage environment according to an embodiment of the invention.

FIG. 1 illustrates an example data storage environment 100 according to an embodiment of the invention. Data storage environment 100 includes a plurality of hosts 10 (1 through M), data storage system 30 and communications medium 18. The storage system 30 includes array controller 12 and RAID array 14. In one example, the hosts 10 are computing devices that issue data read/write requests to the data storage system 30 during the execution of application programs (e.g., a database application) on the hosts 10.

Communication medium 18 provides network connections between the hosts 10 and the data storage system 30. Communications medium 18 may implement a variety of protocols such as Transmission Control Protocol/Internet Protocol (TCP/IP), User Datagram Protocol (UDP), Asynchronous Transfer Mode (ATM), Ethernet, Fibre Channel, Small Computer System Interface (SCSI), combinations thereof, and the like. Furthermore, communications medium 18 may include various components (e.g., cables, switches/routers, gateways/bridges, Network Attached Storage/Storage Area Network (NAS/SAN) appliances/nodes, interfaces, etc.). Moreover, the communications medium 18 is capable of having a variety of topologies (e.g., queue manager-and-spoke, ring, backbone, multi drop, point to-point, irregular, combinations thereof, and so on).

Array controller 12 is constructed and arranged to convert blocks of payload data 16 into various codewords 24 in generator module 32. As shown, generator module 32 includes an outer coder 32A, an inner coder 32B, a load balancing controller 32C, and a reverse unit 32D. Outer code and inner code generation, as well as load balancing and code reversing, will be further explained below. Array controller 12 is also constructed and arranged to send codewords to disks 20(1) through 20(N) of RAID array 14. In one example, array controller 12 is a server, although in some arrangements, array controller 12 may be a dedicated unit of a server, a personal computer, a laptop computer, or the like.

Generator module 32 is constructed and arranged to generate codewords 24 from blocks of payload data 16. More particularly, generator module 32 encodes blocks of payload data 16 while generating parity data for this payload data. The encoding operations are performed using the outer coder 32A, inner coder 32B, load balancing controller 32C, and reverse unit 32D, as will be explained in further detail below. In one example, generator module 32 is software running on the array controller 12, although in some arrangements, generator module 32 is a stand-alone piece of hardware, or some combination of hardware and software.

RAID array 14 is constructed and arranged to store codewords 24 in disks 20(1) through 20(N) of the RAID array 14. During operation, array controller 12 receives payload data 16 over communications medium 18. Payload data 16 is broken into blocks of length K; in some arrangements, array controller 12 breaks payload data into blocks. In turn, generator module 32 takes in each block of payload data and applies a generator matrix of an outer code (from outer coder 32A) to it to create a codeword 24 of length N. This is done for each block. The obtained blocks are further encoded with an inner code via inner coder 32B. Load balancing and code reversing are also applied via 32C and 32D, respectively. It is to be understood that each codeword is typically comprised of information symbols corresponding to the payload data and check symbols corresponding to the parity data.

Array controller 12 then sends codewords 24 to RAID array 14 to be stored in particular stripes across disks 20(1) through 20(N). In this example, array controller 14 stores (or causes to be stored) symbols 1 through N of the codewords, that were encoded by generator module 32, across stripes 28(1) and 28(2). Note that a given stripe is spread across multiple disks, e.g., stripe 28(1) through 28(2) reside across disks 20(1) through 20(N). Further details of array controller 12 are described below with respect to FIG. 2.

Figure 2:
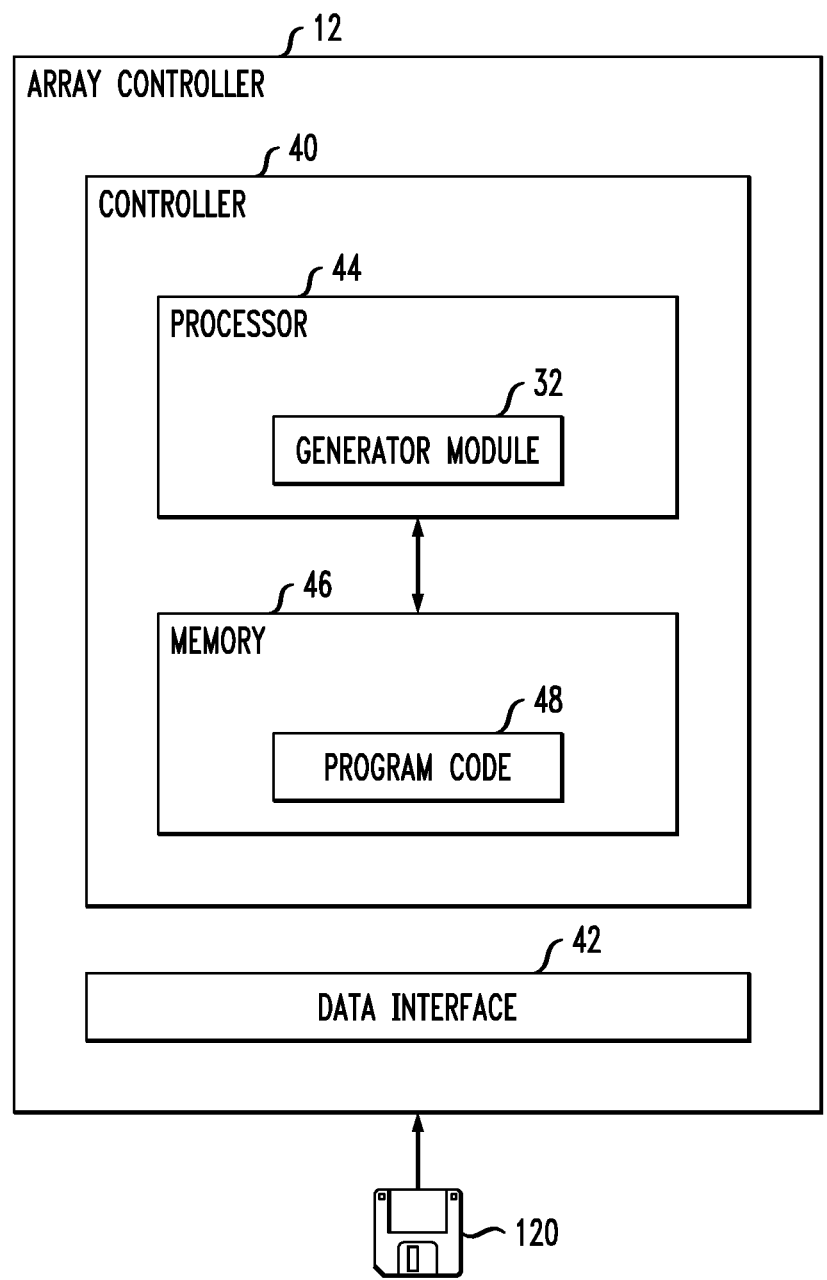
FIG. 2 illustrates an array controller according to an embodiment of the invention.

FIG. 2 illustrates details of an example array controller 12. Array controller 12 includes controller 40, which in turn includes processor 44 and memory 46, and data interface 42, such as a Serial Advanced Technology Attachment (SATA) interface, a Serial Attached SCSI (SAS) interface, a Fiber Channel interface, etc.

Memory 46 is configured to store program code 48 that contains instructions configured to cause processor 44 to carry out methodologies described herein. For example, for array controller 12, program code 48 contains instructions for applying outer/inner codes (see FIG. 1) to blocks of payload data. Memory 46 may take the form of, but is not limited to, random access memory, flash memory or a non-volatile memory.

Processor 44 may take the form of, but is not limited to, one or more central processing units, one or more microprocessors, and a single core or multi-cores each running single or multiple threads. In some arrangements, processor 44 is one of several processors working together. Processor 44 is configured to carry out methodologies and algorithms described herein by executing program code 48. Processor 44 includes generator module 32, although in some arrangements, generator module 32 may be a stand-alone hardware module or software residing in memory. The processor, memory and data interface shown in FIG. 2 comprise one example of a computing device and/or a processing platform upon which methodologies described herein can be implemented.

Given the illustrative data storage system described above, we now describe encoding algorithms according to embodiments of the invention. More particularly, we describe improved methodologies for generating codewords that may, for example, be employed in the generator module 32 of array controller 12. Embodiments of the invention realize that stripe update operation problems, mentioned above in the background section as well as others, may be avoided by employing non-MDS codes over small alphabets which are able to correct large fractions of erasures. One example of such non-MDS code is a generalized concatenated code (GCC). Accordingly, embodiments of the invention employ GCCs for RAID-base data storage systems. As will be explained in detail below, data is stored on disks of the RAID group in such way so that the i-th disk contains the i-th symbols of codewords of a GCC. In the following detailed description, methods for code construction, systematic encoding and load balancing will be described. We first generally describe GCCs.

Generalized Concatenated Codes

A GCC is constructed using a family of $(n, k_i, d_i)$ outer codes $c_i$, over GF(2), $1 \leq i \leq t$, and a family of nested inner $(v, t-i+1, q_i)$ codes $\mathbb{C}_i$, over GF(2). Note that, for the sake of simplicity, in one or more embodiments, we consider only the case of GCCs based on binary linear codes (however, other GCCs may be employed in alternate embodiments). This results in a $(N=nv, K=\Sigma_{i=1}^{t} k_i, D=\min(d_1 q_1, \ldots, d_t q_t))$ linear block code. Codes $\mathbb{C}_i$, $i>1$, induce a recursive decomposition of code $\mathbb{C}_1$ into a number of coset, so that:

$$\mathbb{C}_i = \{c + u_1 g_i | c \in \mathbb{C}_{i+1}, u_1 \in \{0,+,1\}\},$$

where $g_i$, denotes the rows of the generator matrix of $\mathbb{C}_1$.

For the description of an illustrative encoding algorithm, we assume that the generator matrices of outer codes are given in the canonical form $\mathcal{G}^{(i)}=(E|\mathcal{B}^{(i)})$, $i=1, \ldots, t$, where E is $k_i \times k_i$ identity matrix. Generator matrices for inner codes $\mathbb{G}^{(i)}$, $i=1 \ldots v$, can be arbitrary.

As illustrated in methodology 300 of FIG. 3, a payload data sequence $(a_{1,1 \ldots k_1}, \ldots, a_{t,1 \ldots k_t})$, referenced as 310, where $a_{i,u \ldots v}$ denotes the sequence $a_{i,u}, a_{i,u+1}, \ldots, a_{i,v}$, is encoded with a generalized concatenated code as follows:

1. Encoding with outer codes 320, i.e., computation of check symbols for codewords of outer codes (note that in outer codes 320, the shaded symbols are check symbols and the non-shaded symbols are information symbols):

$$a_{i,k_i+1 \ldots n} = a_{i,1 \ldots k_i} \mathcal{B}^{(i)}, i=1, \ldots, t. \quad (1)$$

2. Encoding with the first inner code 330. Let $\Lambda = \mathbb{G}^{(1)T}$, then:

$$c_{1 \ldots v, 1 \ldots n} = \Lambda a_{1 \ldots t, 1 \ldots n}. \quad (2)$$

Obtained sequence $(c_{1,1 \ldots n}, \ldots, c_{v,1 \ldots n})$ is a codeword 340 of GCC. That is, a GCC codeword 340 can be considered as a $v \times n$ table, where each column is a codeword of $\mathbb{C}_1$. This table is obtained by encoding each row of another $t \times n$ table. The i-th row of the latter table is a codeword of $\mathcal{C}_i$, as shown in FIG. 3.

Another way to obtain codeword c (considered as a vector of length vn) is to multiply $(a_{1,1 \ldots k_1}, \ldots, a_{v,1 \ldots k_v})$ by an appropriate generator matrix G. Let us illustrate construction of such a generator matrix by an example. Let the generator matrix for the first inner code be:

$$\mathbb{G}^{(1)} = \begin{pmatrix} 1 & 0 & 0 & 0 \\ 1 & 1 & 0 & 0 \\ 1 & 0 & 1 & 0 \\ 1 & 1 & 1 & 1 \end{pmatrix}$$

Then, the generator matrix for GCC is given by:

$$\mathbb{G} = \begin{pmatrix} (E|B^{(1)}) & 0_{k_1,n} & 0_{k_1,n} & 0_{k_1,n} \\ (E|B^{(2)}) & (E|B^{(2)}) & 0_{k_2,n} & 0_{k_2,n} \\ (E|B^{(3)}) & 0_{k_3,n} & (E|B^{(3)}) & 0_{k_3,n} \\ (E|B^{(4)}) & (E|B^{(4)}) & (E|B^{(4)}) & (E|B^{(4)}) \end{pmatrix} \quad (3)$$

where $0_{a,b}$ is a×b matrix filled with zeros. That is, the 1's in the i-th row of $\mathbb{G}^{(1)}$ are replaced with the generator matrix of the i-th outer code, and 0's are replaced with $k_i \times n$ zero matrices.

Embodiments of the invention employ GCC codes for RAID-based data storage systems. As mentioned above and as will be further explained below, data is stored on disks of the RAID group in such way so that the i-th disk contains the i-th symbols of codewords of a GCC. In the following detailed description, methods for code construction, systematic encoding and load balancing will be described. Note that these methods may, for example, be employed in the data storage system 30 in accordance with array controller 12 (including generator module 32) and RAID array 14.

Code Construction

For given length N and dimension K, appropriate inner and outer codes are identified. In one embodiment, polar codes are used as inner codes and binary linear block codes as outer codes. Generator matrix of $(v=2^s, m)$ polar code is given by some m rows of matrix $F_v = F_2^{\otimes s}$, where $$F_2 = \begin{pmatrix} 1 & 0 \\ 1 & 1 \end{pmatrix},$$

⊗ s denotes s-times Kronecker product of a matrix with itself. So, the number of outer codes t in the proposed construction is equal to the length of inner codes v. We propose to construct the generator matrix of the first inner code as $PF_vP^T$, where P is a permutation matrix corresponding to re-arrangement of $F_v$ rows in the ascending order of their weights. The same permutation is applied to columns of $F_v$, so that the obtained matrix is in a low-triangular form, as needed by a fast encoding algorithm presented below. The generator matrix for the i-th inner code $\mathbb{G}^{(i)}$ consists of (v−i+1) last rows of $PF_vP^T$, with the largest weights.

For outer codes, we take any linear binary codes of length n=N/v and dimension $k_i: \Sigma_{i=1}^v k_i = K$. In particular, it is advantageous to use optimal linear block codes, i.e., codes with the largest possible minimum distance $d_i$ for a given length n and dimension $k_i$. In order to implement systematic encoding, the generator matrices for outer codes is represented as $\mathcal{G}^{(i)} = (E|\mathcal{B}^{(i)})$, $i=1 \ldots v$.

One way to implement decoding of generalized concatenated codes is via a multistage decoding algorithm, which successively tries to recover the symbols of a codeword at level i by using a decoding algorithm for $\mathbb{C}_i$, and invokes a decoder of $\mathcal{C}_i$, in order to recover those symbols, which were not recoverable by an inner decoder. After reconstruction of the codeword of the i-th outer code, each symbol of this codeword is multiplied by the i-th row of the generator matrix of $\mathbb{C}_1$, and the obtained codeword is subtracted from the vector being decoded. Then, decoding proceeds at level i+1 in the same way. Let $\sigma_i$ be the event of successful decoding in the i-th level. Then, the probability of successful GCC decoding $Pr\{\sigma_1, \ldots, \sigma_v\}$ can be expressed via probabilities of successful decoding at levels 1 . . . v as:

$$Pr\{\sigma_1, \ldots, \sigma_v\} = Pr\{\sigma_v | \sigma_1, \ldots, \sigma_{v-1}\} Pr\{\sigma_{v-1} | \sigma_1, \ldots, \sigma_{v-2}\} \ldots Pr\{\sigma_2 | \sigma_1\} Pr\{\sigma_1\}.$$

This implies that a GCC decoding failure probability is given by:

$$P = 1 - \prod_{i=1}^{v} (1 - P_i),$$

where $P_i = 1 - Pr\{\sigma_i | \sigma_1, \ldots, \sigma_{i-1}\}$ is the decoding failure probability in the i-th decoding level. One practical method for construction of GCCs is to select $k_i$ so that $P_i$ are approximately equal, i.e.:

$$P_1 \approx P_2 \approx \ldots \approx P_v \approx P. \quad (4)$$

In one embodiment, an algorithm or methodology such as is illustrated in program code 400 in FIG. 4 is used for computing dimensions of outer codes. That is, the methodology of FIG. 4 is used in order to find the value of P, together with the outer code dimensions $k_i$, so that the constraints (4) and $\Sigma_{i=1}^v k_i = K$ are satisfied. The methodology of FIG. 4 implements a bisection method for solving non-linear equations.

This methodology assumes the ability to calculate a decoding failure probability for outer and inner codes of different dimensions. Such calculation is given by:

$$P_i(s) = \sum_{j=1}^{n} S_j^{(s)} p_i^j (1-p_i)^{n-j} \quad (5)$$

$$p_i = \sum_{j=1}^{v} \mathbb{S}_j^{(i)} p^j (1-p)^{v-j}, i = 1 \ldots v, \quad (6)$$

where p is a channel erasure probability (i.e., disk failure probability), $S_j^{(s)}$ is the number of uncorrectable erasure configurations of weight j for outer code of dimension s, and $\mathbb{S}_j^{(i)}$ is the number of uncorrectable erasure configurations of weight j for the first information symbol for the i-th inner code. Erasure configuration is uncorrectable for some code C if there exist two codewords c, c'∈C for which $c_j = c'_j$ for all non-erased symbols. Erasure configuration is uncorrectable for the first information symbol if there exist at least two codewords, corresponding to different values of the first information symbol, which agree on all non-erased symbols.

Systematic Encoding

An illustrative embodiment of systematic encoding will now be described under an assumption that the generator matrix of the first inner code $\mathbb{G}^{(1)}$ is a low-triangular one with units on the diagonal, and generator matrices of outer codes are given in the canonical form $g^{(i)} = (E|\mathcal{B}^{(i)})$, i=1, ..., v.

The encoding algorithm for the case of non-systematic GCC includes two steps given by expressions (1) and (2) above. Let the symbols $C_{i,1 \ldots k_i}$, i=1 ..., v, be the information symbols of a GCC codeword c. To obtain the whole GCC codeword, the methodology reconstructs check symbols $c_{i,k_i+1 \ldots n}$, i=1 ..., v. Since $\Lambda = (\mathbb{G}^{(1)})^T$ is an upper triangular matrix with units on the diagonal, it is invertible and $\Lambda^{-1}$ is also an upper triangular matrix with units on the diagonal. Hence, according to expression (2), $a_{1 \ldots v, 1 \ldots n} = \Lambda^{-1} c_{1 \ldots v, 1 \ldots n}$, and it is evident that $a_{i,1 \ldots k_i} (\Lambda^{-1})_{i,i} \ldots v c_{i \ldots v, 1 \ldots k_i}$ and $a_{i,k_i+1 \ldots n}$, where $Q_{u,v}$ denotes the submatrix of matrix Q given by row indices u and column indices v. Plugging the expressions for $a_{i,1 \ldots k_i}$ and $a_{i,k_i+1 \ldots n}$ into expression (1), one obtains the following system of linear equations:

$$(\Lambda^{-1})_{i,i \ldots v} c_{i \ldots v, k_i+1 \ldots n} = ((\Lambda^{-1})_{i,i \ldots v} c_{i \ldots v, 1 \ldots k_i}) \mathcal{B}^{(i)}. \quad (7)$$

Since $\Lambda^{-1}$ has units on the diagonal, $(\Lambda^{-1})_{i,i \ldots v} c_{i \ldots v, k_i+1 \ldots n} = c_{i,k_i+1 \ldots n} + (\Lambda^{-1})_{i,i+1 \ldots v} c_{i+1 \ldots v, k_i+1 \ldots n}$. Hence, we obtain the following expression for check symbols:

$$c_{i,k_i+1 \ldots n} = ((\Lambda^{-1})_{i,i \ldots v} c_{i \ldots v, 1 \ldots k_i}) \mathcal{B}^{(i)} - (\Lambda^{-1})_{i,i+1 \ldots v} c_{i+1 \ldots v, k_i+1 \ldots n}, i=v, \ldots, 2, 1. \quad (8)$$

Example 1

Consider systematic encoding for (16, 9) GCC with outer codes (4, 1), (4, 2), (4, 3), (4, 3).

The symbols $c_{1,1}, c_{2,1 \ldots 2}, c_{3,1 \ldots 3}, c_{4,1 \ldots 3}$ are information symbols as illustrated in symbol chart 500 in FIG. 5 (note that, in symbol chart 500, the shaded symbols are check symbols and the non-shaded symbols are information symbols). The check symbols are computed according to expression (8) as follows:

1. $c_{4,4} = c_{4,1 \ldots 3} \mathcal{B}^{(4)}$,
2. $c_{3,4} = (c_{3,1 \ldots 3} + c_{4,1 \ldots 3}) \mathcal{B}^{(3)} - c_{4,4}$,
3. $c_{2,3 \ldots 4} = (c_{2,1 \ldots 2} + c_{4,1 \ldots 2}) \mathcal{B}^{(2)} - c_{4,3 \ldots 4}$,
4. $c_{1,2 \ldots 4} = (c_{1,1} + c_{2,1} + c_{3,1} + c_{4,1}) \mathcal{B}^{(1)} - c_{2,2 \ldots 4} - c_{3,2 \ldots 4} - c_{4,2 \ldots 4}$.

Figure 3:
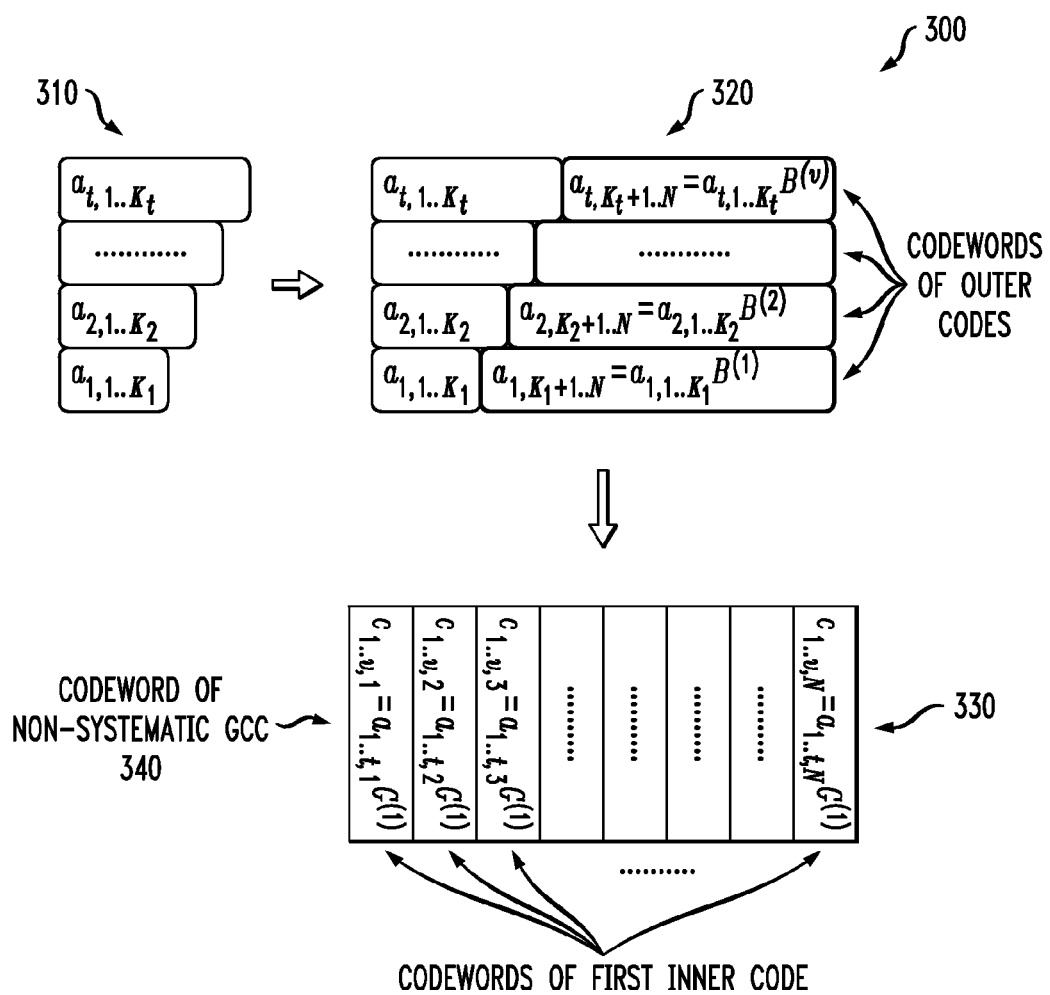
FIG. 3 illustrates a non-systematic encoding with generalized concatenated code according to an embodiment of the invention.

The complexity (XORs number) of a systematic encoding algorithm is equal to the complexity of the original non-systematic encoding algorithm of GCC (e.g., FIG. 3). Hence, the encoding complexity is given by the complexity of multiplication by generator matrices of outer codes and the complexity of multiplication by matrix $\Lambda^{-1}$. It is evident that the first one is equal to $$\frac{1}{a} \sum_{i=1}^{v} k_i (n - k_i),$$

where a is a sparsity coefficient for generator matrices of outer codes. Since $\Lambda^{-1}$ is obtained by permuting rows and columns of Arikan matrix $F_2^{\otimes s}$, multiplication by this matrix can be implemented with complexity $$\frac{1}{2} v \log v.$$

This is much less than the complexity of multiplication of a vector by a generic low-triangular matrix, which is given by $\mathcal{O}(v^2)$. It is to be noted that n such multiplications have to be performed. Hence, the total complexity of a systematic encoding algorithm is given by:

$$\text{Complexity}_{enc} = \frac{1}{2} n v \log v + \frac{1}{a} \sum_{i=1}^{v} k_i (n - k_i). \quad (9)$$

In the case of high rate code, this expression is dominated by the first term.

Recall, that this fast systematic encoding algorithm is suitable for the case low-triangular generator matrix for the first inner code. Additional complexity reduction is achieved by employing polar codes as inner codes.

If length of inner codes is equal to the length of outer codes, i.e., $v = n = \sqrt{N}$, then the expression for complexity (9) reduces to $$\text{Complexity}_{enc} = \frac{1}{2} N \log \sqrt{N} + \frac{1}{a} \sum_{i=1}^{\sqrt{N}} k_i (\sqrt{N} - k_i).$$

Load Balancing

In a RAID-based data storage system, the symbols of a codeword are typically stored on separate disks. If one needs to update some information symbol $u_i$, then corresponding check symbols, which depend on the $u_i$ must also be updated to preserve the consistency. Hence, check symbols are updated much more frequently than information symbols. This may cause significant disk load imbalance and increase wearing of disks used to store check symbols.

In one embodiment, a load balancing method for GCC includes two parts: (1) load balancing for outer code codewords; and (2) load balancing for inner code codewords.

We first consider load balancing for outer codes. In one embodiment, the methodology is based on load balancing for linear block codes. Let us consider some (n, k) code generated by matrix $g$. The update rate for the j-th codeword symbol is given by:

$$\lambda_j = r w_j, j = 1 \ldots n,$$

where r is the update rate of information symbols, and $w_j \geq 1$ is the number of non-zero elements in the j-th column of $\mathcal{G}$.

To avoid significant disk load imbalance, different generator matrices for the same code should be used for different stripes. By employing appropriate row operations, it is possible to construct L generator matrices $G_l$ containing the (k×k) identity submatrix E on different positions; the set of such positions is called an information set. This results in a disk update rate being given by:

$$\lambda_j = \frac{\rho}{L}\sum_{l=1}^{L} w_{li}, 1 \leq i \leq n,$$

i.e., disk load imbalance is averaged over multiple stripes. By appropriate construction of matrices $G_l$, it is possible to make $\lambda_i$ to be approximately the same, thus achieving uniform disk load.

Example 2

Consider a (n=6, k=3) binary linear code with generator matrix $$G_1 = \begin{pmatrix} 1 & 0 & 0 & 1 & 0 & 1 \\ 0 & 1 & 0 & 1 & 1 & 0 \\ 0 & 0 & 1 & 1 & 1 & 1 \end{pmatrix}.$$

It can be verified that the following matrices are also generator matrices for this code:

$$G_2 = \begin{pmatrix} 1 & 1 & 1 & 1 & 0 & 0 \\ 1 & 0 & 1 & 0 & 1 & 0 \\ 0 & 1 & 1 & 0 & 0 & 1 \end{pmatrix}, G_3 = \begin{pmatrix} 1 & 0 & 1 & 0 & 1 & 0 \\ 0 & 1 & 0 & 1 & 1 & 0 \\ 0 & 1 & 1 & 0 & 0 & 1 \end{pmatrix},$$

$$G_4 = \begin{pmatrix} 1 & 0 & 0 & 1 & 0 & 1 \\ 0 & 1 & 1 & 0 & 0 & 1 \\ 0 & 0 & 1 & 1 & 1 & 1 \end{pmatrix}, G_5 = \begin{pmatrix} 1 & 1 & 1 & 1 & 0 & 0 \\ 0 & 1 & 0 & 1 & 1 & 0 \\ 1 & 0 & 0 & 1 & 0 & 1 \end{pmatrix},$$

$$G_6 = \begin{pmatrix} 1 & 1 & 0 & 0 & 1 & 1 \\ 1 & 0 & 1 & 0 & 1 & 0 \\ 1 & 0 & 0 & 1 & 0 & 1 \end{pmatrix}.$$

It is to be understood that, in general, an arbitrary combination of k positions within a codeword does not represent an information set. That is, one cannot store the information symbols anywhere within a codeword. The reason is that obtaining an identity submatrix in a generator matrix on these positions requires the corresponding columns of the generator matrix to be linearly independent. This is not always the case.

In order to evaluate disk load imbalance, the following metric is suggested:

$$F(Q) = \sum_{j=1}^{n} |\lambda_j - \beta|,$$

where $\beta$ is average of $\lambda_j$, j=1, . . . , n over family Q of information sets. Minimization of F(Q) provides approximately the same update rates for all symbols of a codeword, which corresponds to improved load balancing.

We could identify a family of information sets $I^{(i)}$ for each outer code $c_i$, i=1 . . . v, and use them for storing of information symbols. However, information sets for outer codes could not be chosen independently, because rows of GCC codeword depend on each other. In order to use a systematic encoding algorithm, information sets for outer codes should be nested. Indeed, in this case for given families of information sets $I^{(v)} \subset I^{(v-1)} \subset \ldots I^{(1)}$, it is possible to perform the same reordering of columns of generator matrices for all outer codes and obtain generator matrices in the following form: $\mathcal{G}^{(i)} = (E | \mathcal{B}^{(i)})$, i.e. $\mathcal{G}^{(i)} = \mathcal{G}^{(i)} \tilde{P}$, where $\tilde{P}$ is n×n is a permutation matrix. This operation corresponds to the multiplication of a generator matrix of GCC (see equation (3) above) by a permutation matrix, for example, if v=4, then:

$$\tilde{G} = G \begin{pmatrix} \tilde{P} & 0_{n,n} & 0_{n,n} & 0_{n,n} \\ 0_{n,n} & \tilde{P} & 0_{n,n} & 0_{n,n} \\ 0_{n,n} & 0_{n,n} & \tilde{P} & 0_{n,n} \\ 0_{n,n} & 0_{n,n} & 0_{n,n} & \tilde{P} \end{pmatrix} = \tag{10}$$

$$\begin{pmatrix} (E | \tilde{B}^{(1)}) & 0_{k_1,n} & 0_{k_1,n} & 0_{k_1,n} \\ (E | \tilde{B}^{(2)}) & (E | \tilde{B}^{(2)}) & 0_{k_2,n} & 0_{k_2,n} \\ (E | \tilde{B}^{(3)}) & 0_{k_3,n} & (E | \tilde{B}^{(3)}) & 0_{k_3,n} \\ (E | \tilde{B}^{(4)}) & (E | \tilde{B}^{(4)}) & (E | \tilde{B}^{(4)}) & (E | \tilde{B}^{(4)}) \end{pmatrix}$$

If information sets $I^{(1)}, \ldots, I^{(v)}$ are not nested, then it is not possible to construct such a permutation matrix for generator matrix G.

FIG. 6 illustrates a randomized algorithm in the form of program code 600, which constructs families of nested information sets $Q^{(i)}$ for outer codes $c_i$, i=1 . . . v, minimizing $\Sigma_{i=1}^{v} F(Q^{(i)})$. $c_i$ are generated by $\mathcal{G}^{(i)}$, i=1 . . . v. The algorithm is randomized, i.e., it constructs T different families of nested information sets $Q^{(i)}:I_1^{(1)} \subset \ldots \subset I_1^{(v)}, I_1^{(i)} \in Q^{(i)}$, i=1 . . . v, and selects the one that minimizes $\Sigma_{i=1}^{v} F(Q^{(i)})$.

We next consider load balancing for inner codes. The above described approach based on employing a number of different information sets of outer codes provides load balancing inside each row of GCC codeword. However, load balancing for columns of a GCC codeword is also needed, since the number of information symbols corresponding to the i-th row is always $k_i$ and $k_1 \leq k_2 \leq \ldots \leq k_v$. In one embodiment, load balancing for columns of a GCC codeword is implemented by arranging symbols of inner code codewords in reverse order. This results in another (N, K) GCC which is given by the same set of outer codes $c_i$, and the set of inner codes $\mathbb{C}'_i$, i=1 . . . v, where $\mathbb{C}'_i$ is the code generated by matrix $(\mathbb{G}^{(i)})^z$, where $W^z$ is a vertically symmetric matrix to the matrix W, i.e.:

$$W^z = W \begin{pmatrix} 0 & \ldots & 0 & 1 \\ 0 & \ldots & 1 & 0 \\ \ldots & \ldots & \ldots & \ldots \\ 1 & 0 & \ldots & 0 \end{pmatrix}$$

For v=4, this leads to the following modification of the generator matrix for GCC (see expression (10)).

$$\tilde{G}' = \begin{pmatrix} 0_{k_1,n} & 0_{k_1,n} & 0_{k_1,n} & (E|\tilde{B}^{(1)}) \\ 0_{k_2,n} & 0_{k_2,n} & (E|\tilde{B}^{(2)}) & (E|\tilde{B}^{(2)}) \\ 0_{k_3,n} & (E|\tilde{B}^{(3)}) & 0_{k_3,n} & (E|\tilde{B}^{(3)}) \\ (E|\tilde{B}^{(4)}) & (E|\tilde{B}^{(4)}) & (E|\tilde{B}^{(4)}) & (E|\tilde{B}^{(4)}) \end{pmatrix} \quad (11)$$

One half of the data stored in the disks is encoded with the original GCC generated by expression (10) and the second half belongs to the modified GCC generated by expression (11). In this case in average, the i-th row of GCC codeword contains $(k_i+k_{v-i+1})/2$ information symbols (due to properties of GCC $(k_1+k_v) \approx (k_2+k_{v-1}) \approx \ldots$).

Note that, in one or more embodiments, the above-described outer code generation, inner code generation, load balancing, and code reversing, are respectively performed via outer coder 32A, inner coder 32B, load balancing controller 32C, and reverse unit 32D of generator module 32 in FIG. 1.

Accordingly, as illustrated above, error correcting codes are used in the design of redundant disk arrays. The smallest redundancy is achieved by employing maximum distance separable (MDS) codes. The simplest construction (known as RAID-4 and RAID-5) is based on the single-parity check code, which provides protection against single disk failure. If one needs to implement protection against multiple disk failures, then codes with higher redundancy are needed.

For small values of redundancy, N−K=2, it is possible to construct MDS array codes with quite small encoding and decoding complexity. For example, in the case of RDP and Even/Odd, the matrix representation of a codeword is used and values of redundant symbols are calculated according to different diagonals of the matrix. However, the extension of these schemes to the case of higher N−K is not straightforward and, in general, requires increasing symbol size and results in significant encoding and decoding complexity.

For a construction based on a linear code with generator matrix G=(E|B), where B is a K×(N−K) Cauchy matrix over field $\mathbb{F}_{2^m}$, it is quite difficult to build a practical fast algorithm for multiplication by a Cauchy matrix. As such, in conventional implementations, encoding is implemented in a straightforward way with complexity O(K(N−K)). Erasure recovery requires multiplication by a Cauchy matrix and solving a system of linear equations given by another Cauchy matrix (both are submatrices of B). By exploiting the properties of Cauchy matrix, the last step can be implemented with complexity $O(t^2)$, where t is the number of erasures (disk failures).

Reed-Solomon codes have also been suggested for use in storage systems. Reed-Solomon codes require employing arithmetic operations in large finite fields, which induces high encoding and decoding complexity.

RAID-2 represents the first application of non-MDS codes in the design of disk arrays. It is based on Hamming codes, which can provide protection against up to 3 disk failures. However, the required number of parity disks is given by $\lceil \log(N) \rceil$, where N is the number of disks in RAID.

Encoding of GCCs, as in the case of any other linear block codes, can be implemented via multiplication of a payload data vector by the corresponding generator matrix. Many applications can use systematic encoding which corresponds to employing generator matrices given by G=(E|B) for some matrix B. For a binary linear code of length N and dimension K, the average complexity of a straightforward implementation of this approach is K(N−K)/γ operations, where γ is sparsity coefficient.

The complexity of the systematic encoding algorithm embodiments of the invention is given by $$\text{Complexity}_{enc} = \frac{1}{2}nv\log v + \frac{1}{a}\sum_{i=1}^{v} k_i(n-k_i),$$

where v is length of inner codes, n is length outer codes, and $k_i$, i=1, ... v are dimensions of outer codes. The length of a GCC is N=nv (usually $v \approx n \approx \sqrt{N}$) and the dimension is $K = \sum_{i=1}^{v} k_i$. In the case of high-dimensional codes, it is dominated by the first term which is approximately equal to $$\frac{1}{2}N\log\sqrt{N} = \frac{1}{4}N\log N.$$

This is much less than the complexity of straightforward multiplication by the generator matrix, which costs O(K(N−K)).

Figure 7:
FIG. 7 illustrates encoding complexity for a conventional encoding technique and an improved encoding technique according to one or more embodiments of the invention.

Table 700 in FIG. 7 presents a comparison of the complexity of the proposed systematic GCC encoding algorithm with classical encoding based on multiplication by a generator matrix. The complexity is obtained as an average number of XOR operations needed by the encoder over all information sets used for load balancing.

Table 800 in FIG. 8 presents the number of arithmetic operations ("X" represents XOR, "M" represents multiplication) per one payload byte needed for updating different number of stripe units in different RAID systems. It can be seen that RAID implementation based on GCCs requires a much smaller number of arithmetic operations compared to a similar Reed-Solomon based RAID. Observe also that GCC encoding and decoding does not require employing expensive Galos field multiplication operations, as in the case of Reed-Solomon codes. This comes at the cost of higher redundancy needed to achieve the same data loss probability with GCCs.

Although polar codes provide asymptotically optimal erasure correcting capability, for small block length (i.e., small number of disks), improved codes can be constructed. The theory of GCCs enables one to easily obtain appropriate long codes from shorter codes, together with the corresponding efficient encoding algorithm.

Figure 9:
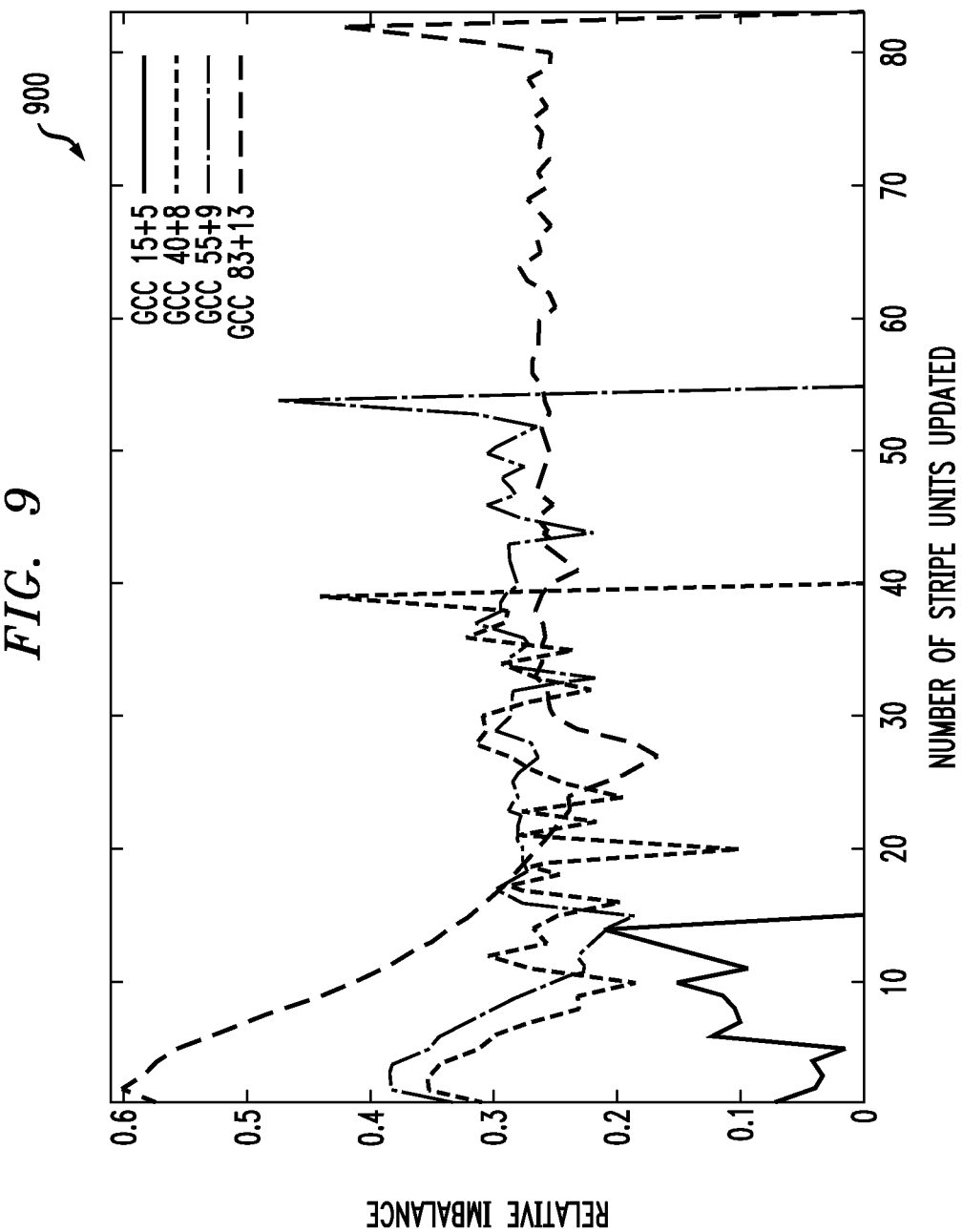
FIGS. 9 and 10 illustrate disk load imbalance associated with the use of generalized concatenated codes according to one or more embodiments of the invention.
Figure 10:
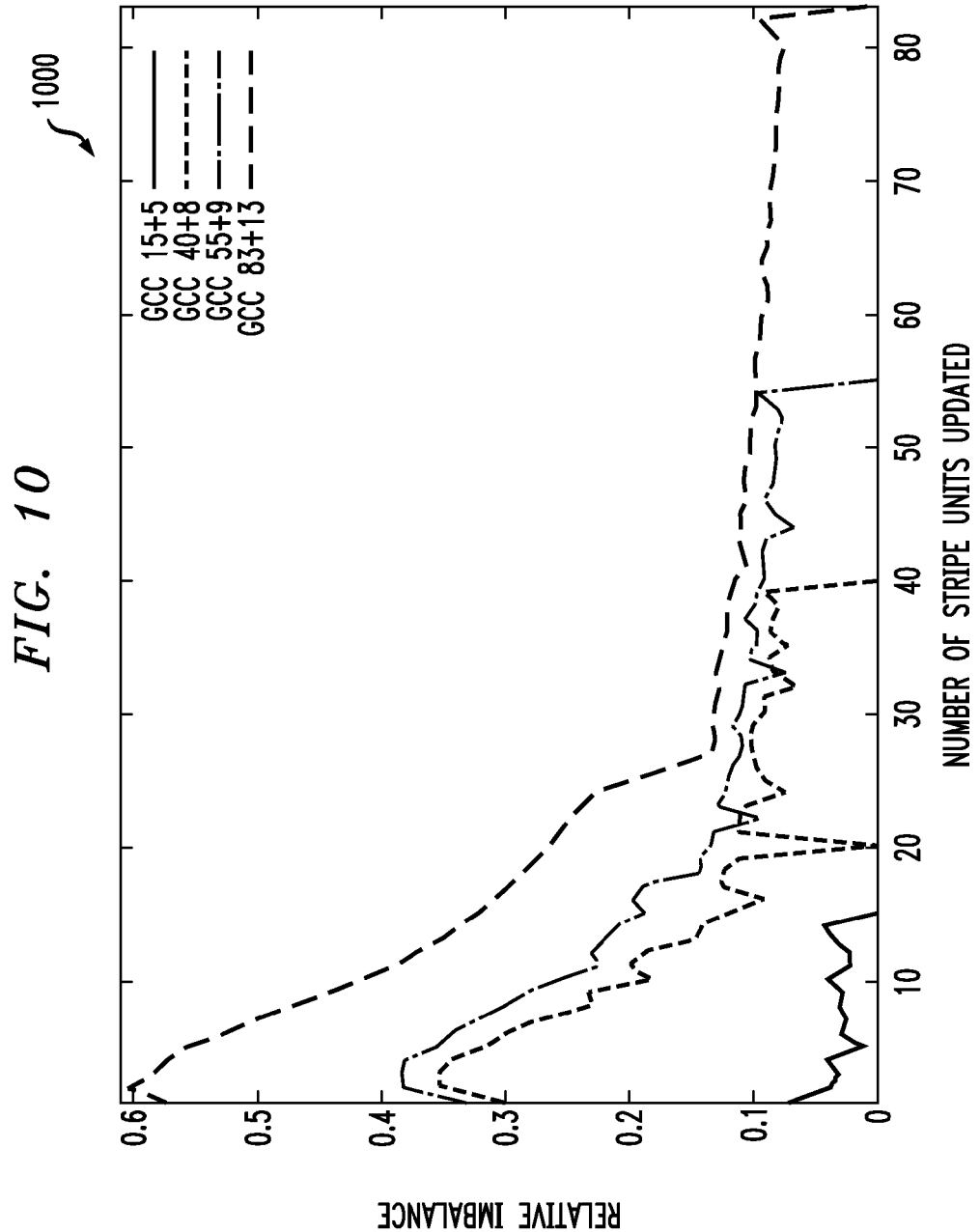

Disk load imbalance for a GCC-based RAID can be characterized by the metric $\Sigma_{j=1}^{N} |\lambda_j - \beta|/(\beta N)$, where $\lambda_j$ is update rate for j-th symbol of codeword and β is average among $\lambda_j$, j=1 ... N. In graph 900 in FIG. 9 and graph 1000 in FIG. 10, this metric is used in order to illustrate relative disk load imbalance depending on the number of symbols being updated for the case of read and write operations, respectively. It can be seen that an average value of the metric is under 0.3 for read operations and under 0.2 for write operations.

While various embodiments of the invention have been particularly shown and described, it will be understood by those skilled in the art that various changes in form and details may be made therein without departing from the spirit and scope of the invention as defined by the appended claims.

For example, it should be understood that some embodiments are directed to array controller 12, which is constructed and arranged to update data stored on a redundant array of disks having an array controller in a storage system, each disk of the redundant array of disks including a disk controller apart from the array controller. Some embodiments are directed to a process of updating data stored on a redundant array of disks having an array controller in a storage system, each disk of the redundant array of disks including a disk controller apart from the array controller. Also, some embodiments are directed to a computer program product which enables computer logic to update data stored on a redundant array of disks having an array controller in a storage system, each disk of the redundant array of disks including a disk controller apart from the array controller.

It should also be understood that some embodiments are directed to array controller 12, which is constructed and arranged to store data in a redundant disk array that employs a code which transforms an information vector of information symbols of length K into a codeword of code symbols of length N. Embodiments are directed to a process of storing data in a redundant disk array that employs a code which transforms an information vector of information symbols of length K into a codeword of code symbols of length N.

In other arrangements, array controller 12 is implemented by a set of processors or other types of control/processing circuitry running software. In such arrangements, the software instructions can be delivered, within array controller 12, either in the form of a computer program product 120 (see FIG. 2) or simply instructions on disk or in pre-loaded in memory 46 of array controller 12, each computer program product having a computer readable storage medium which stores the instructions in a non-volatile manner. Alternative examples of suitable computer readable storage media include tangible articles of manufacture and apparatus such as CD-ROM, flash memory, disk memory, tape memory, and the like.

What is claimed is:

1. A method comprising steps of:
obtaining data at a data storage system;
generating codewords from the obtained data, wherein the codewords are computed using a generalized concatenated code and each codeword comprises symbols, the symbols comprising information symbols and check symbols; and
storing the codewords on an array of disks associated with the data storage system, wherein the storing step further comprises load balancing the symbols of the generated codewords across the array of disks whereby update rates for the symbols are uniform with respect to each of the disks, and wherein the step of load balancing a given codeword further comprises load balancing an outer code portion of the given codeword and load balancing an inner code portion of the given codeword.

2. The method of claim 1, wherein the storing step further comprises storing i-th symbols of the generated codewords on an i-th disk of the array of disks.

3. The method of claim 1, wherein the step of generating codewords further comprises generating codewords comprising outer codes and inner codes.

4. The method of claim 3, wherein outer code codewords comprise binary linear codes.

5. The method of claim 3, wherein inner code codewords comprise polar codes.

6. The method of claim 3, wherein the step of generating codewords further comprises encoding with the outer codes and inner codes using code generator matrices.

7. The method of claim 6, wherein the outer code portion load balancing step further comprises load balancing outer code codewords.

8. The method of claim 7, wherein the step of load balancing outer code codewords further comprises using different generator matrices for the same outer code for different storage partitions on the array of disks.

9. The method of claim 7, wherein the step of load balancing outer code codewords further comprises nesting sets of information symbols.

10. The method of claim 6, wherein the inner code portion load balancing step further comprises load balancing inner code codewords.

11. The method of claim 10, wherein the step of load balancing inner code codewords further comprises arranging symbols of inner code codewords in reverse order.

12. A computer program product comprising a processor-readable storage medium having encoded therein executable code of one or more software programs, wherein the one or more software programs when executed by a processor implement the steps of the method of claim 1.

13. An apparatus, comprising:
a memory; and
a processor operatively coupled to the memory and configured to:
obtain data at a data storage system;
generate codewords from the obtained data, wherein the codewords are computed using a generalized concatenated code and each codeword comprises symbols, the symbols comprising information symbols and check symbols; and
store the codewords on an array of disks associated with the data storage system, wherein the storing step further comprises load balancing the symbols of the generated codewords across the array of disks whereby update rates for the symbols are uniform with respect to each of the disks, and wherein the step of load balancing a given codeword further comprises load balancing an outer code portion of the given codeword and load balancing an inner code portion of the given codeword.

14. The apparatus of claim 13, wherein the processor is further configured to perform the storing step by storing i-th symbols of the generated codewords on an i-th disk of the array of disks.

15. The apparatus of claim 13, wherein the processor is further configured to perform the generating step by generating codewords comprising outer codes and inner codes.

16. The apparatus of claim 15, wherein outer code codewords comprise binary linear codes.

17. The apparatus of claim 15, wherein inner code codewords comprise polar codes.

18. The apparatus of claim 15, wherein the processor is further configured to perform the outer code portion load balancing step by load balancing outer code codewords.

19. The apparatus of claim 15, wherein the processor is further configured to perform the inner code portion load balancing step by load balancing inner code codewords.

20. A data storage system comprising:
an array controller; and
an array of disks operatively coupled to the array controller;
wherein the array controller is configured to: obtain data; generate codewords from the obtained data, wherein the codewords are computed using a generalized concatenated code and each codeword comprises symbols, the symbols comprising information symbols and check symbols; and send the generated codewords to the array of disks for storage, wherein storage comprises load balancing the symbols of the generated codewords across the array of disks whereby update rates for the symbols are uniform with respect to each of the disks, and wherein the step of load balancing a given codeword further comprises load balancing an outer code portion of the given codeword and load balancing an inner code portion of the given codeword.

* * * * *